United States Patent
Shimizu (10) Patent No.: US 10,574,238 B2
(45) Date of Patent: Feb. 25, 2020

(54) INSPECTION CIRCUIT, SEMICONDUCTOR STORAGE ELEMENT, SEMICONDUCTOR DEVICE, AND CONNECTION INSPECTION METHOD

(71) Applicant: LAPIS SEMICONDUCTOR CO., LTD., Kanagawa (JP)

(72) Inventor: Michiaki Shimizu, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 108 days.

(21) Appl. No.: 15/879,522

(22) Filed: Jan. 25, 2018

(65) Prior Publication Data

US 2018/0226973 A1    Aug. 9, 2018

(30) Foreign Application Priority Data

Feb. 6, 2017   (JP) .................................. 2017-019790

(51) Int. Cl.
*H03K 19/177*    (2006.01)
*H03K 19/1776*   (2020.01)
(Continued)

(52) U.S. Cl.
CPC ... *H03K 19/1776* (2013.01); *G01R 31/31712* (2013.01); *G01R 31/31723* (2013.01);
(Continued)

(58) Field of Classification Search
CPC .. H03K 19/1776; G11C 29/46; G11C 29/022; G11C 29/1201; G01R 31/31723;
(Continued)

(56) References Cited

U.S. PATENT DOCUMENTS 5,321,204 A * 6/1994 Ko ........................ H01L 21/50
                                                    174/551
6,607,940 B2 * 8/2003 Yasunaga ............... H01L 21/561
                                                    438/112

(Continued)

FOREIGN PATENT DOCUMENTS

JP    2008249388 A    10/2008
JP    2010190839 A     9/2010

*Primary Examiner* — Giovanni Astacio-Oquendo
(74) *Attorney, Agent, or Firm* — Volentine, Whitt & Francos, PLLC (57) ABSTRACT

An inspection circuit for inspecting a connection state between a semiconductor storage element including a storage section, and a semiconductor element connected to the semiconductor storage element, the inspection circuit includes: an input terminal that is input with a test signal to be sent to a first controller; an input/output terminal that is input and output with data to be written to or read from the storage section; a first inspection section that is input with an inspection signal; a second inspection section, disposed between the input terminal and the first controller, that converts the test signal to a control signal at a predetermined logic level under control of the first inspection section; and a third inspection section, disposed between the input/output terminal and a second controller, that sends the test signal to the second controller under control of the first inspection section.

11 Claims, 7 Drawing Sheets

(51) Int. Cl.
    *G01R 31/317*     (2006.01)
    *G01R 31/3185*     (2006.01)
    *G11C 29/02*     (2006.01)
    *G11C 29/46*     (2006.01)
    *G11C 29/12*     (2006.01)

(52) U.S. Cl.
    CPC .... *G01R 31/318513* (2013.01); *G11C 29/022* (2013.01); *G11C 29/1201* (2013.01); *G11C 29/46* (2013.01); *G01R 31/31717* (2013.01)

(58) Field of Classification Search
    CPC ...... G01R 31/318513; G01R 31/31712; G01R 31/31717
    USPC ........................ 324/762.02, 762.01, 538, 537
    See application file for complete search history.

(56) References Cited

U.S. PATENT DOCUMENTS

| | | | |
|---|---|---|---|
| 6,965,154 B2 * | 11/2005 | Abe | H01L 23/49575 |
| | | | 257/506 |
| 9,991,716 B2 * | 6/2018 | Cutright | G05B 19/048 |
| 9,992,855 B2 * | 6/2018 | Larroux | H05G 1/58 |
| 2017/0319097 A1 * | 11/2017 | Amthor | A61B 5/055 |

\* cited by examiner

INSPECTION CIRCUIT, SEMICONDUCTOR STORAGE ELEMENT, SEMICONDUCTOR DEVICE, AND CONNECTION INSPECTION METHOD

CROSS-REFERENCE TO RELATED APPLICATION

This application claims priority under 35 USC 119 from Japanese Patent Application No. 2017-019790, filed on Feb. 6, 2017, the disclosure of which is incorporated by reference herein.

BACKGROUND

Technical Field

The present disclosure relates to an inspection circuit, a semiconductor storage element, a semiconductor device, and a connection inspection method. In particular, the present disclosure relates to an inspection circuit, a semiconductor storage element, a semiconductor device, and a connection inspection method for inspecting a semiconductor device including plural semiconductor elements within a single package.

Related Art

The semiconductor module disclosed in Japanese Patent Application Laid-Open (JP-A) No. 2008-249388 is an example of a known inspection technology in semiconductor devices that include plural semiconductor elements within a single package. This semiconductor module includes switches connected to a test terminal at one end of wiring lines to be tested, and transistors that apply a ground potential to the other ends of the wiring lines to be tested. A source potential is applied to a wiring line being tested, and a ground potential is applied to wiring lines not being tested. Thereby, a potential difference is generated between the wiring line being tested and the other wiring lines, which is used to detect shorting faults.

Also known is the semiconductor device disclosed in JP-A No. 2010-190839. This semiconductor device includes a first device having an output buffer circuit and a second device having an internal input buffer circuit. A wire connects an internal output terminal of the first device with an internal input terminal of the second device. The second device includes resistors connected to the internal input terminal and switches respectively connected to the resistors. By controlling the switches and controlling the voltage of the internal output terminal of the first device, the semiconductor device detects the output current of the output buffer circuit and the input leakage current of the input buffer circuit.

Semiconductor devices employing a multi-chip package (MCP) are another known type of semiconductor devices that include plural semiconductor elements within a single package. MCP is a general term for packages that incorporate plural semiconductor devices. A variety of different MCPs exist, such as configurations in which plural semiconductor elements are stacked vertically, and configurations in which plural semiconductor elements are arranged horizontally. The method for checking connections between such plural semiconductor elements is one technical issue facing semiconductor devices in which plural semiconductor elements are mounted therein.

Here, as one example of a semiconductor device packaged using MCP, a semiconductor device in which semiconductor elements, such as single data rate (SDR)/double data rate (DDR) synchronous dynamic random access memory (referred to below as DRAM) and a controller IC, are mounted (referred to below as MCP memory), in considered. Generally, connections between the DRAM and the controller IC are checked using a method that writes/reads between the DRAM and the controller IC, or using a method that measures the value of current from the DRAM.

Often, control signals for one semiconductor element to control another semiconductor element are exchanged between plural semiconductor elements in MCP memory. Circuit control within a semiconductor device often employs control signals that enable specific functionality using pre-determined logic (HIGH or LOW) signals. Cases in which a specific function is enabled by a "high level" are referred to as "active high", and cases in which a specific function is enabled by a "low level" are referred to as "active low".

Here, in MCP memory, a case in which a short abnormality (short circuit) has occurred within the MCP when a terminal of a DRAM chip is connected to a terminal of a controller IC, is considered. In such case, a short abnormality can be easily detected at address terminals (such as A0), command terminals (such as CLK, CK, and RAS), DQ terminals (such as DQ0), and the like by writing/reading from the controller IC to the DRAM. This is possible since the above terminals are not in a fixed level, and in practice, expected values and actual values can be compared at any time.

However, in the case of DRAM chip select (hereafter, "CS") terminals and clock enable (hereafter, "CKE") terminals, were a short abnormality caused by CS terminal fixed at a LOW level (hereafter, "L level") or were a short abnormality caused by CKE terminal fixed at a HIGH level (hereafter, "H level"), the DRAM would still operate correctly in both cases. Thus, it is difficult to detect short abnormality in CS terminals and CKE terminals, since CS terminals are active low and CKE terminals are active high, since both CS terminals and CKE terminals are enabled by control signals that are either H level or L level. Note that the above is merely an example control logic of a CS terminal and a CKE terminal, and obviously the opposite logic may also be employed.

The semiconductor module of JP-A No. 2008-249388 and the semiconductor device of JP-A No. 2010-190839 detect connection abnormalities between terminals of semiconductor elements mounted within a single package However, differences in operation based on levels between individual terminals are not discussed in the above disclosures.

SUMMARY

The present disclosure provides an inspection circuit, a semiconductor storage element, a semiconductor device, and a connection inspection method that may easily detecting a short circuit, even in cases in which the short circuit that has occurred is to a logic value that enables a specific function.

A first aspect of the present disclosure is an inspection circuit that executes an inspection of a connection state between a semiconductor storage element including a storage section that stores data, and a semiconductor element connected to the semiconductor storage element, the inspection circuit including: an input terminal that is input with a test signal to be sent to a first controller; an input/output terminal that is input with data to be written to the storage section and that outputs data read from the storage section; a first inspection section that is input with an inspection signal; a second inspection section, disposed between the input terminal and the first controller, that converts the test signal to a control signal at a predetermined logic level under control of the first inspection section; and a third inspection section, disposed between the input/output terminal and a second controller, that sends the test signal to the second controller under control of the first inspection section.

A second aspect of the present disclosure is a semiconductor device including: the inspection circuit of the first aspect; the storage section; the first controller, the first controller being configured to execute a given function accompanying storage in the storage section when a control signal is at a predetermined logic level; and the second controller, the second controller being configured to control writing of data to the storage section and reading of data from the storage section.

A third aspect of the present disclosure a semiconductor device including: the semiconductor storage element of the second aspect, and the semiconductor element.

A third aspect of the present disclosure a connection inspection method that uses an inspection circuit included in a semiconductor storage element, the semiconductor storage element including a storage section that stores data and a controller that executes a given function accompanying storage in the storage section in a case in which a control signal is at a predetermined logic level, the connection inspection method including: inputting a test signal through an input terminal that is input with a signal sent to the controller; at a timing for writing to the storage section, converting the test signal to a control signal of the predetermined logic level, and inputting the converted signal to the controller; writing, at the timing for writing to the storage section, the test signal to the storage section; reading the test signal stored in the storage section; and inspecting a connection state between an input terminal of the semiconductor storage element and a terminal corresponding to the input terminal on a semiconductor element connected to the semiconductor storage element by comparing the test signal written to the storage section to the test signal read from the storage section.

According to the above aspects, the present disclosure provides an inspection circuit, a semiconductor storage element, a semiconductor device, and a connection inspection method that may detect a short circuit, even in cases in which the short circuit that has occurred is to a logic value that enables a specific function.

BRIEF DESCRIPTION OF THE DRAWINGS

Exemplary embodiments will be described in detail based on the following figures, wherein.

DETAILED DESCRIPTION

Detailed explanation follows regarding exemplary embodiments of the present disclosure, with reference to the drawings.

First Exemplary Embodiment

Explanation follows regarding an inspection circuit, a semiconductor storage element, a semiconductor device, and a connection inspection method according to the present exemplary embodiment, with reference to FIG. 1 to FIG. 4. In the present exemplary embodiment, configuration is made so as to detect a short abnormality (short circuit) affecting a CS terminal of DRAM.

Figure 1:
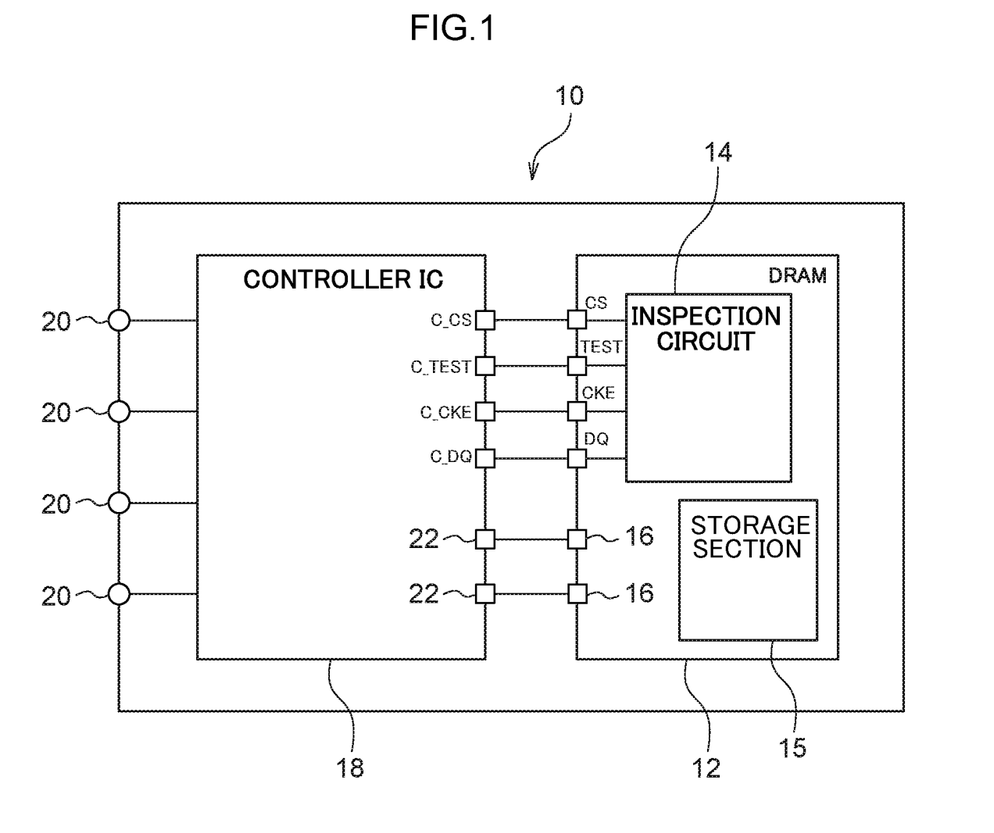
FIG. 1 is a block diagram illustrating a configuration of a semiconductor device according to an exemplary embodiment.

As illustrated in FIG. 1, a semiconductor device 10 according to the present exemplary embodiment is configured including DRAM 12 and a controller IC 18. The DRAM 12 and the controller IC 18 are mounted in a package. The package configuration is not particularly limited, but the semiconductor device 10 according to the present exemplary embodiment employs MCP. The semiconductor device 10 includes external terminals 20 for connecting to external components and the like.

The DRAM 12 is a semiconductor storage element according to the present exemplary embodiment, and is configured including an inspection circuit 14, which is an inspection circuit according to the present exemplary embodiment, and a storage section 15 that stores data therein. As illustrated in FIG. 1, the inspection circuit 14 includes a chip select (CS) terminal, a TEST terminal, a clock enable (CKE) terminal, and a DQ terminal. These terminals configure a portion of the terminals 16 used for external connections to the DRAM 12. Note that, in the present exemplary embodiment, configuration is made to detect short abnormalities (short circuit) at the CS terminal of the DRAM 12, and therefore explanation follows using the example of an inspection circuit 14 including a CS terminal, a TEST terminal, and a DQ terminal.

The controller IC 18 is a semiconductor element that is primarily used to control the DRAM 12. The controller IC 18 includes a C_CS terminal, a C_TEST terminal, a C_CKE terminal, and a C_DQ terminal, which configure a portion of the terminals 22 of the controller IC 18. The C_CS terminal, the C_TEST terminal, the C_CKE terminal, and the C_DQ terminal are respectively connected to the CS terminal, the TEST terminal, the CKE terminal, and the DQ terminal of the DRAM 12, and configure output terminals that output control signals to control the CS terminal, the TEST terminal, the CKE terminal, and the DQ terminal of the DRAM 12, or configure input terminals that receive signals from the DRAM 12.

Figure 2:
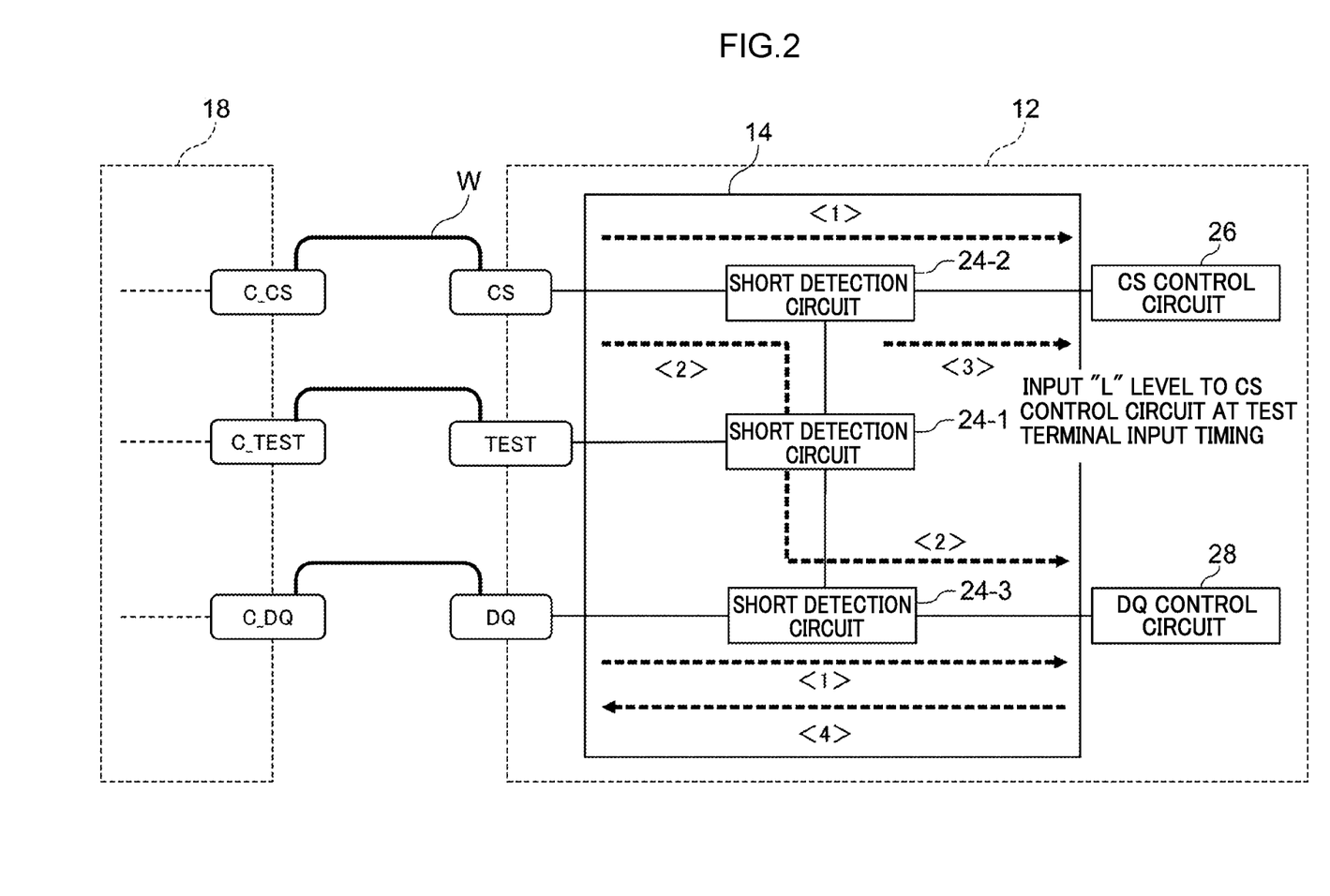
FIG. 2 is a block diagram illustrating a configuration of an inspection circuit according to a first exemplary embodiment.

Next, detailed explanation follows regarding the inspection circuit 14 according to the present exemplary embodiment, with reference to FIG. 2. As illustrated in FIG. 2, the inspection circuit 14 is configured including the CS terminal, the TEST terminal, and the DQ terminal, as well as short detection circuits 24-1, 24-2, 24-3 (these are also referred to collectively as "short detection circuits 24" hereafter). Note that the CS control circuit 26 and the DQ control circuit 28 in FIG. 2 configure part of the DRAM 12.

The CS terminal is a device selection signal input terminal. Input through other signal lines is enabled while this signal is being asserted. The CS control circuit 26 is a circuit that executes operations in response to a signal input to the CS terminal. The CS terminal is connected to the C_CS terminal of the controller IC 18. The controller IC 18 controls a chip selection function by sending a CS signal from the C_CS terminal to the CS terminal of the DRAM 12. Note that although the CS terminal according to the present exemplary embodiment is activated at the L level (is enabled at the L level, namely, is active low), obviously the opposite logic may also be employed.

The DQ terminal is an input/output terminal for data signals. The DQ control circuit 28 writes data to memory (for example, 1-bit memory) in the DRAM 12 in response to a signal input to the DQ terminal, and reads, from the DQ terminal, data that has been written from the memory in the DRAM 12 in response to a control signal from the DQ terminal. The DQ terminal is connected to the C_DQ terminal of the controller IC 18. The controller IC 18 sends data signals from the C_DQ terminal to the DQ terminal, and also accepts data signals output from the DQ terminal through the C_DQ terminal.

The TEST terminal is an input terminal for a control signal to control the inspection circuit 14. The TEST terminal is connected to the short detection circuit 24-1. The short detection circuits 24-2 and 24-3 are each connected to the short detection circuit 24-1, and are controlled via the short detection circuit 24-1. The TEST terminal is connected to the C_TEST terminal of the controller IC 18. The controller IC 18 controls the inspection circuit 14 by sending a control signal (inspection signal) used to control inspection from the C_TEST terminal to the inspection circuit 14.

As illustrated in FIG. 2, bonding wires, printed board patterns, bumps (in the case of flip chip mounting), or the like are used to make connections between the C_CS terminal and the CS terminal, between the C_DQ terminal and the DQ terminal, and between the TEST terminal and the C_TEST terminal. In the present exemplary embodiment, these connections are configured by bonding wires W. The short detection circuits 24 are circuits that detect short abnormalities (short circuit) in these connections. Namely, the inspection circuit 14 according to the present exemplary embodiment is a circuit that detects short abnormalities in the connections between the DRAM 12 and the controller IC 18.

As illustrated in FIG. 2, the short detection circuit 24-2 is disposed between the CS terminal and the CS control circuit 26, and controls input to the CS control circuit 26. The short detection circuit 24-3 is disposed between the DQ terminal and the DQ control circuit 28, and controls input and output of the DQ control circuit 28. The short detection circuit 24-1 is connected to the TEST terminal as well as the short detection circuit 24-2 and the short detection circuit 24-3, and controls the short detection circuits 24-2, 24-3 in response to an inspection signal input via the TEST terminal.

Next, explanation follows regarding operation of the inspection circuit 14. The inspection circuit 14 has a normal mode, this being operation in a normal state, and an inspection mode, this being operation during inspection. As illustrated by the dashed arrow labeled <1>, in the normal mode, signals sent from the C_CS terminal to the CS terminal are input to the CS control circuit 26 so as to control the CS control circuit 26. Similarly, as illustrated by the dashed arrow labeled <1>, data signals sent from the C_DQ terminal to the DQ terminal are input to the DQ control circuit 28. Further, as illustrated by the dashed arrow labeled <4>, data signals read from the DRAM 12 are sent from the DQ control circuit 28 to the C_DQ terminal of the controller IC 18 via the DQ terminal. Note that the reference numbers depicted by <X> in the following explanation indicate corresponding locations in the drawings.

In the inspection mode, the controller IC 18 sends a TEST signal from the C_TEST terminal to the TEST terminal of the DRAM 12 to activate (actuate) the short detection circuits 24-1, 24-2, 24-3. When this is performed, the CS terminal is isolated from the CS control circuit 26 at the short detection circuit 24-2. Namely, the CS control circuit 26 is applied with an L level signal from the short detection circuit 24-2 via the route labeled <3> in FIG. 2, placing the interior of the DRAM 12 in a WRT command state. As described above, the CS terminal according to the present exemplary embodiment is active low.

At the same time, the DQ terminal is isolated from the DQ control circuit 28 at the short detection circuit 24-3, and a signal (test signal) that is input to the DQ control circuit 28 through the CS terminal, via the route labeled <2> in FIG. 2, is written to the DRAM 12. The data written to the DRAM 12 is read by the controller IC 18 through the DQ terminal via the route labeled <4> in FIG. 2. The above operation enables inspection as to whether or not a short abnormality has arisen between the C_CS terminal and the CS terminal. Namely, in the inspection mode, a signal via the route labeled by the dashed arrow <3> is an input signal for the CS control circuit 26, and a signal indicated by the dashed arrow <2> is an input (write) data signal for the DQ control circuit 28.

Figure 3:
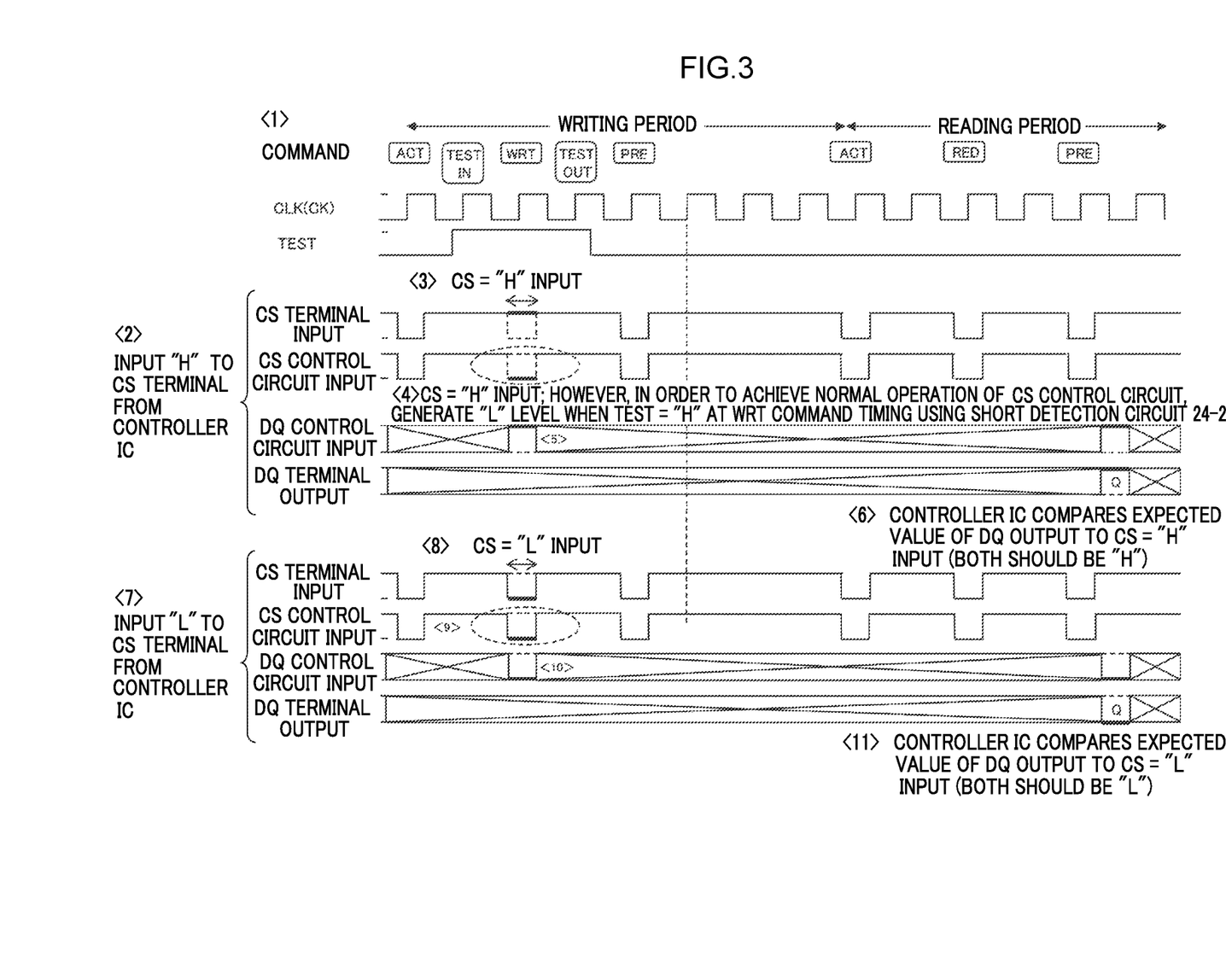
FIG. 3 is a timing chart illustrating correct operation of an inspection circuit according to the first exemplary embodiment.
Figure 4:
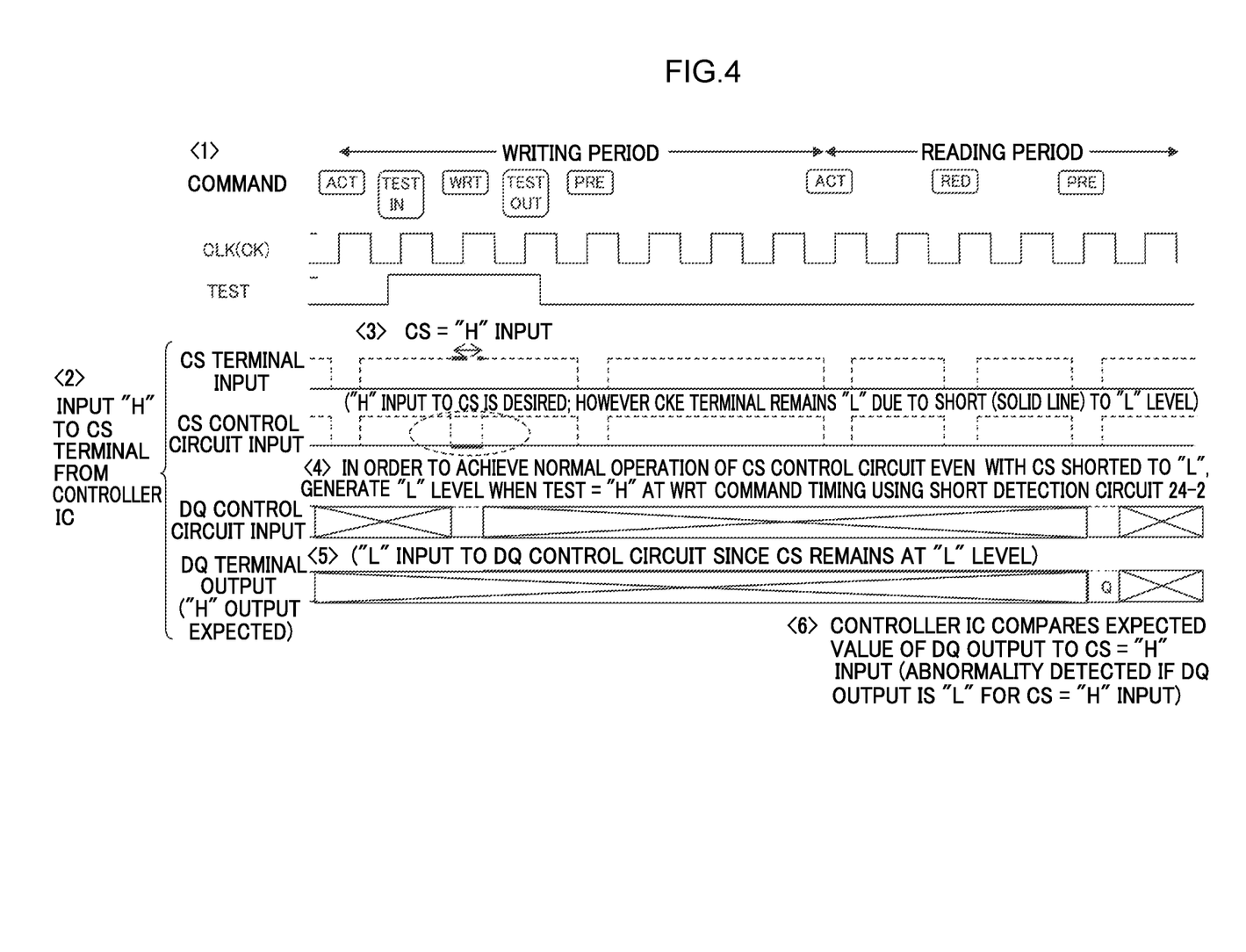
FIG. 4 is a timing chart illustrating abnormal operation of an inspection circuit according to the first exemplary embodiment.

More detailed explanation follows regarding operation of the inspection circuit 14, with reference to FIG. 3 and FIG. 4. FIG. 3 is a timing chart illustrating operation of the inspection circuit 14 in a case in which a short abnormality has not occurred between the C_CS terminal and the CS terminal. FIG. 3 illustrates commands sent from the controller IC 18 to the DRAM 12 and the waveforms at respective sections. FIG. 4 is a timing chart illustrating operation of the inspection circuit 14 in a case in which a short abnormality has occurred between the C_CS terminal and the CS terminal. FIG. 4 illustrates commands sent from the controller IC 18 to the DRAM 12 and the waveforms at respective sections.

As illustrated at <1> in FIG. 3, in the present operation example, writing and reading are performed in this sequence. In a write operation, an ACT (active) command, a WRT (write) command, and a PRE (pre-charge) command are sent as commands from the controller IC 18 to the DRAM 12 in this sequence, and one bit of data is written to a memory cell in the DRAM 12. In the present exemplary embodiment, for example, memory cells are configured by one-bit cells. A TEST IN command between the ACT command and the WRT command, and a TEST OUT command between the WRT command and the PRE command configure inspection operation commands in the present exemplary embodiment. Namely, the inspection circuit 14 is controlled using the TEST IN command and the TEST OUT command. The TEST IN command is a command to activate (start operation of) the inspection circuit 14, and the TEST OUT command is a command to de-activate (stop operation of) the inspection circuit 14. In a read operation, an ACT (active) command, a RED (read) command, and a PRE (pre-charge) command are set from the controller IC 18 to the DRAM 12 in this sequence, and one bit of data is read from a one-bit cell of the DRAM 12.

The waveforms of a clock signal CLK (CK) and a test signal TEST are also illustrated at <1> in FIG. 3. The test signal TEST is a signal input to the TEST terminal of the DRAM 12 from the C_TEST terminal of the controller IC 18 during the inspection operation. Setting this TEST signal to the H level causes the inspection circuit 14 to transition to the inspection mode (activate the inspection circuit 14) and causes the short detection circuits 24 to operate.

Explanation follows regarding operation when an H level is input to the CS terminal of the DRAM 12 from the C_CS terminal of the controller IC 18 in cases in which a short abnormality has not occurred between the C_CS terminal and the CS terminal, with reference to <2> in FIG. 3. In this operation, an H level is written from the C_CS terminal of the controller IC 18 via the CS terminal of the DRAM 12, and this H level is read from the DRAM 12.

To begin, a signal input to the CS terminal has the waveform as illustrated at <3> in FIG. 3. Namely, since the signal input to the CS terminal is active low, and the CS control circuit 26 operates when the input signal is set to L level at timings corresponding to commands. An H level is input to the CS terminal at the WRT command timing in order to write an H level to the DRAM 12. However, in order to achieve normal operation of the CS control circuit 26, as illustrated at <4> in FIG. 3, the input of the CS control circuit 26 is converted to L level by the short detection circuit 24-2 at the WRT command timing.

As illustrated at <5> in FIG. 3, the signal input to the DQ control circuit 28 at the WRT command timing is H level due to an H level CS signal being input via the short detection circuits 24-2, 24-1, 24-3. Namely, an H level is written to the DRAM 12. Accordingly, in a read operation, as illustrated at <6> in FIG. 3, an H level is read via the DQ terminal, with the logic of the write data and the logic of the read data of the DRAM 12 matching each other at the H level. The controller IC 18 therefore determines the connection between the C_CS terminal and the CS terminal to be correct.

Next, explanation follows regarding operation when an L level is input to the CS terminal of the DRAM 12 from the C_CS terminal of the controller IC 18 in cases in which a short abnormality has not occurred between the C_CS terminal and the CS terminal, with reference to <7> in FIG. 3. In this operation, an L level is written from the C_CS terminal of the controller IC 18 via the CS terminal of the DRAM 12, and this L level is read from the DRAM 12.

To begin, a signal input to the CS terminal has the waveform as illustrated at <8> in FIG. 3. Namely, an L level is input to the CS terminal at a WRT command timing in order to write an L level to the DRAM 12. Since the CS control circuit 26 normally operates at the L level, as illustrated at <9> in FIG. 3, the short detection circuit 24-2 inputs an L level signal to the CS control circuit 26 at the WRT command timing.

As illustrated at <10> in FIG. 3, the signal input to the DQ control circuit 28 at the WRT command timing is at the L level due to an L level CS signal being input via the short detection circuits 24-2, 24-1, 24-3. Namely, an L level is written to the DRAM 12. Accordingly, in a read operation, as illustrated at <11> in FIG. 3, an L level is read via the DQ terminal, the logic of the write data and the logic of the read data matches with each other at the L level. The controller IC 18 therefore determines the connection between the C_CS terminal and the CS terminal to be correct.

Next, explanation follows regarding operation of the inspection circuit 14 in cases in which a short abnormality has occurred between the C_CS terminal and the CS terminal, with reference to FIG. 4. This example assumes a short abnormality to the L level, for example a short circuit to a power source VSS, has occurred between the C_CS terminal and CS terminal. The commands, the CLK (CK) signal, and the TEST signal illustrated at <1> in FIG. 4 are similar to those illustrated at <1> in FIG. 3, and so detailed explanation thereof is omitted.

As illustrated at <2> in FIG. 4, in this example, at a WRT command timing, the controller IC 18 sends an H level from the C_CS terminal as an input signal (test signal) to inspect the CS terminal of the DRAM 12. However, since a short to the L level has occurred between the C_CS terminal and the CS terminal, as illustrated at <3> in FIG. 4, the CS terminal input remains at the L level. In order to achieve normal operation of the CS control circuit 26, as illustrated at <4> in FIG. 3, the short detection circuit 24-2 sends an L level to the CS control circuit 26.

However, in this example, when attempting to write an H level to the 1-bit memory in the DRAM 12, since the signal input to the CS terminal remains at the L level, as illustrated at <5> in FIG. 4, the short detection circuit 24-3 sends an L level to the DQ control circuit 28. As illustrated at <6> in FIG. 4, the controller IC 18 therefore reads an L level from the DRAM 12 via the DQ terminal. Even if an H level has been written, the level read from the DRAM 12 will always be L level. Since the write data and the read data do not match, the controller IC 18 determines that a short abnormality to the L level has occurred in the connection between the C_CS terminal and the CS terminal.

As described above, the inspection circuit, the semiconductor storage element, the semiconductor device, and the connection inspection method according to the present exemplary embodiment may easily detect a short abnormality (short circuit), in cases in which the short abnormality has occurred in the connection between the C_CS terminal of the controller IC 18 and the CS terminal of the DRAM 12.

Second Exemplary Embodiment

Figure 5:
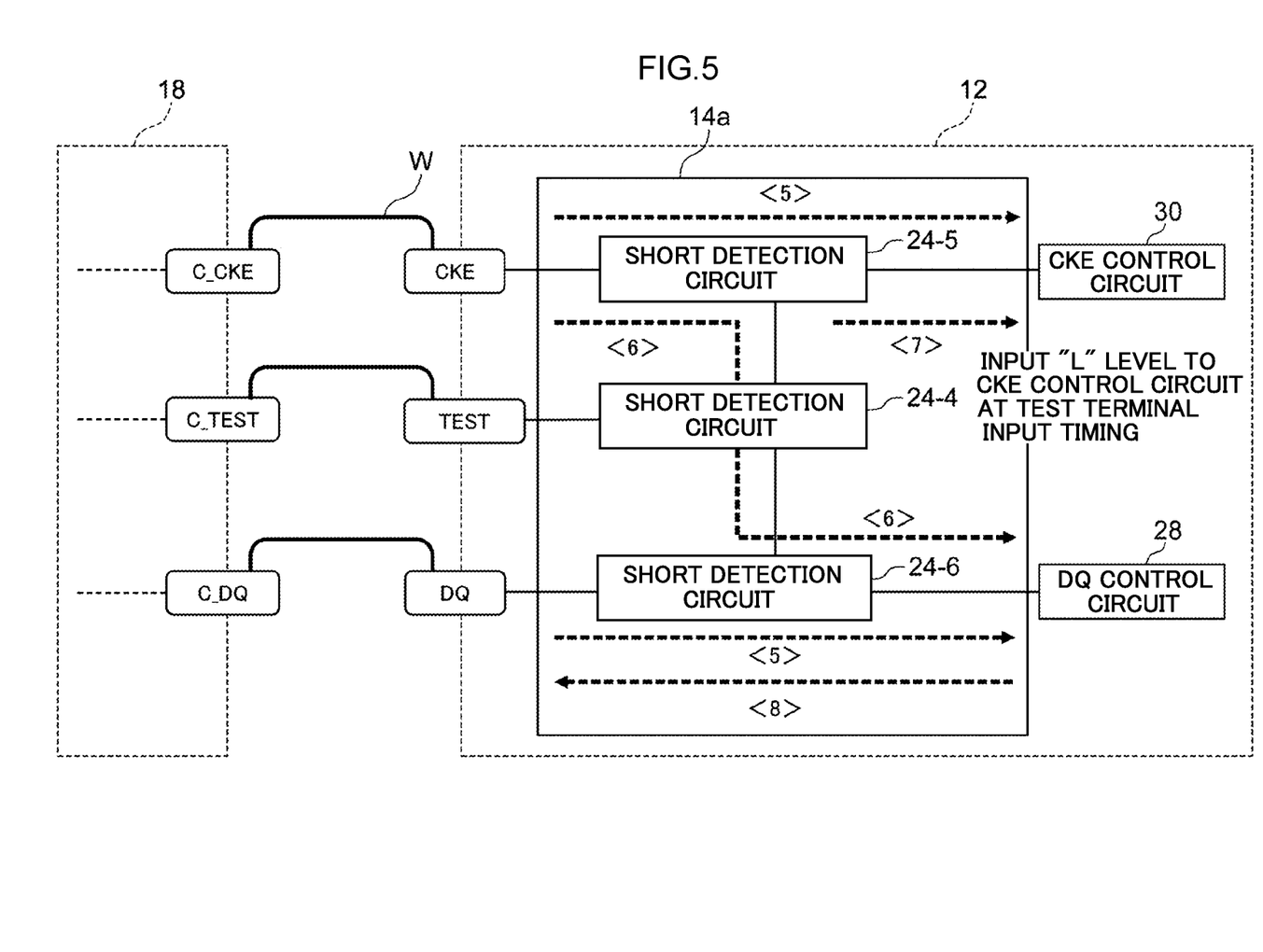
FIG. 5 is a block diagram illustrating a configuration of an inspection circuit according to a second exemplary embodiment.
Figure 6:
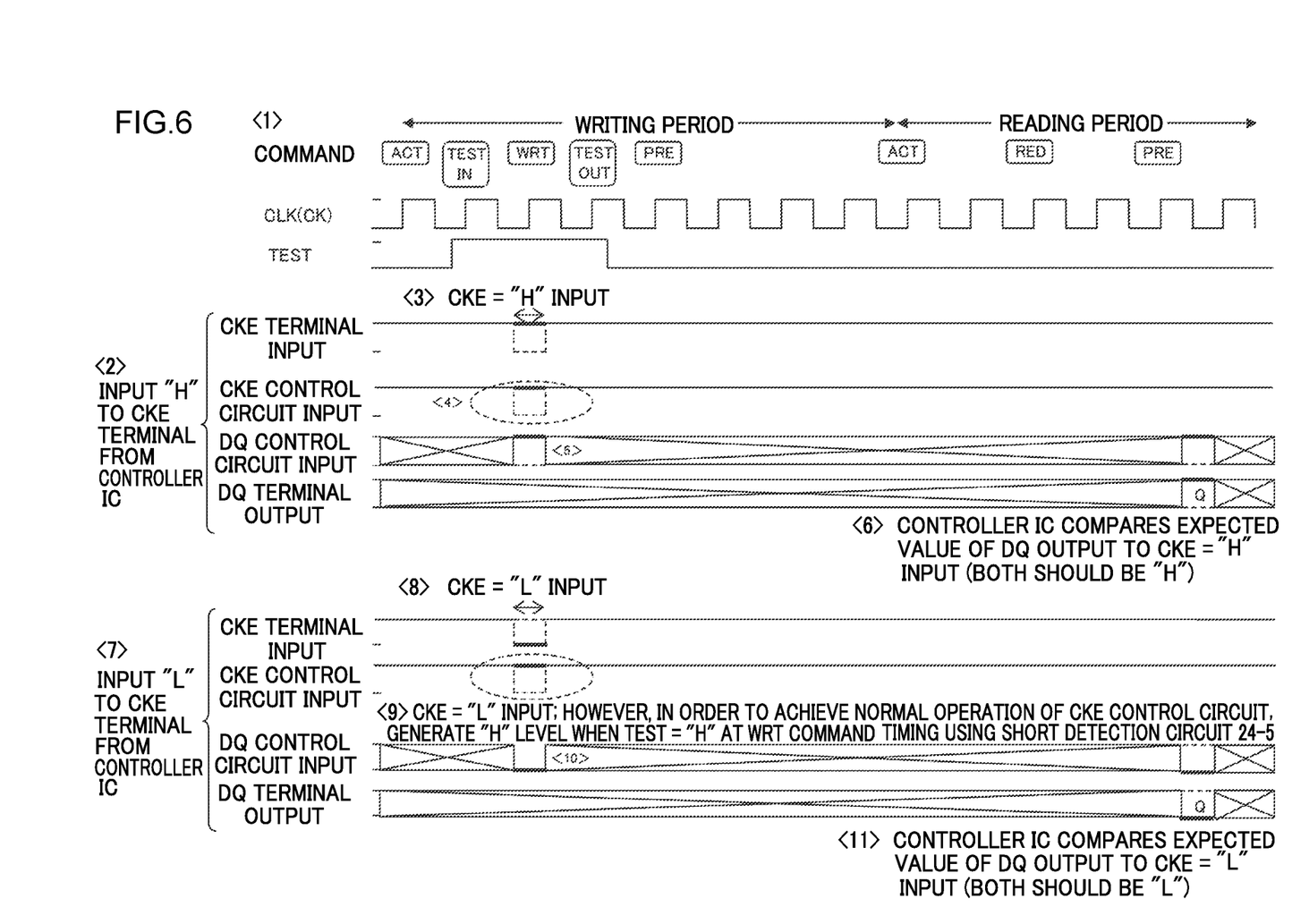
FIG. 6 is a timing chart illustrating correct operation of an inspection circuit according to the second exemplary embodiment.
Figure 7:
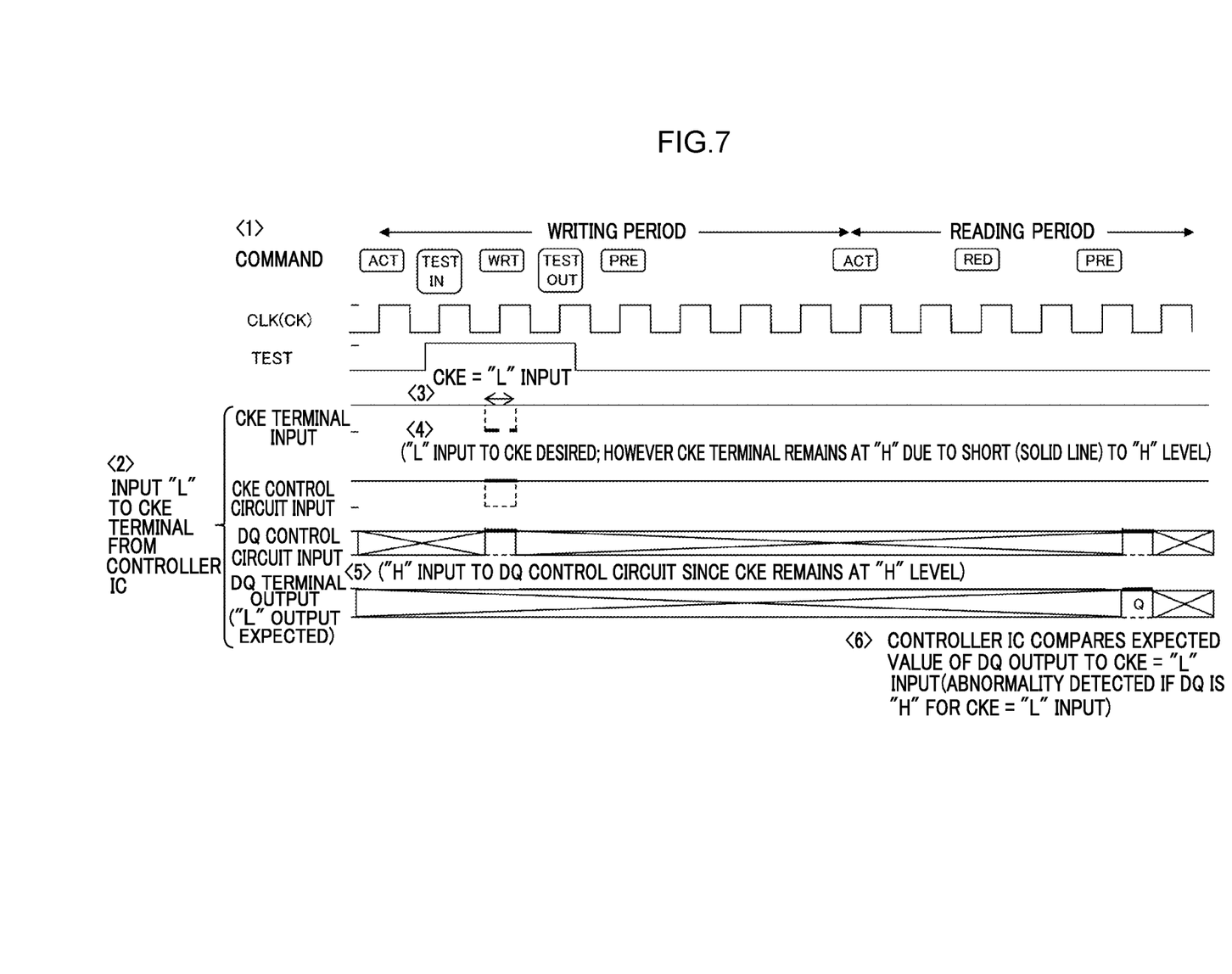
FIG. 7 is a timing chart illustrating abnormal operation of an inspection circuit according to the second exemplary embodiment.

Explanation follows regarding an inspection circuit, a semiconductor storage element, a semiconductor device, and a connection inspection method according to an exemplary embodiment, with reference to FIG. 5 to FIG. 7. In the present exemplary embodiment, configuration is made so as to detect a short abnormality (short circuit) affecting a CKE terminal of DRAM.

As illustrated in FIG. 5, an inspection circuit 14a according to the present exemplary embodiment is configured including a CKE terminal, a TEST terminal, a DQ terminal, and short detection circuits 24-4, 24-5, 24-6 (these are also referred to collectively as "short detection circuits 24" hereafter). The CKE control circuit 30 and the DQ control circuit 28 in FIG. 5 configure part of the DRAM 12. Note that as the present exemplary embodiment is configured to detect short abnormalities (short circuit) affecting the CKE terminal of the DRAM 12, the terminals of the inspection circuit 14a include the CKE terminal, the TEST terminal, and the DQ terminal.

The CKE terminal is an input terminal for a clock enable signal. Input of a clock is enabled while this signal is being asserted. The CKE control circuit 30 is a circuit that executes operations in response to a signal input to the CKE terminal. The CKE terminal is connected to the C_CKE terminal of the controller IC 18. The controller IC 18 controls a clock enable function by sending a CKE signal from the C_CKE terminal to the CKE terminal of the DRAM 12. Note that, although the CKE terminal according to the present exemplary embodiment is activated at the H level (is enabled at an H level, namely, is active high), obviously the opposite logic may also be employed. The DQ terminal and the DQ control circuit 28 are both similar to those illustrated in FIG. 2, and so detailed explanation thereof is omitted.

The TEST terminal is an input terminal for a control signal to control the inspection circuit 14a, and is connected to the short detection circuit 24-4. The TEST terminal is connected to the C_TEST terminal of the controller IC 18. The controller IC 18 controls the inspection circuit 14a by sending a control signal from the C_TEST terminal of the controller IC 18 to the inspection circuit 14a.

In FIG. 5, bonding wires, printed board patterns, or the like are used make connections between the C_CKE terminal and the CKE terminal, between the C_DQ terminal and the DQ terminal, and between the TEST terminal and the C_TEST terminal. In the present exemplary embodiment, these connections are configured by bonding wires W. The short detection circuits 24 are circuits that detect short abnormalities (short circuit) in these connections. Namely, the inspection circuit 14a according to the present exemplary embodiment is a circuit that detects short abnormalities in the connections between the DRAM 12 and the controller IC 18.

As illustrated in FIG. 5, the short detection circuit 24-5 is disposed between the CKE terminal and the CKE control circuit 30, and controls input to the CKE control circuit 30. The short detection circuit 24-6 is disposed between the DQ terminal and the DQ control circuit 28, and controls input and output of the DQ control circuit 28. The short detection circuit 24-4 is connected to the TEST terminal as well as the short detection circuits 24-5, 24-6, and controls the short detection circuits 24-5, 24-6 in response to input signals (inspection signals) input from the TEST terminal.

Next, explanation follows regarding operation of the inspection circuit 14a. The inspection circuit 14a has a normal mode and an inspection mode, similarly to the inspection circuit 14. As illustrated by the dashed arrow labeled <5>, in the normal mode, signals sent from the C_CKE terminal to the CKE terminal are input to the CKE control circuit 30 so as to control the CKE control circuit 30. Similarly, as illustrated by the dashed arrow labeled <5>, data signals sent from the C_DQ terminal to the DQ terminal are input to the DQ control circuit 28 to write to the DRAM 12. Further, as illustrated by the dashed arrow labeled <8>, read signals from the DRAM 12 are sent from the DQ control circuit 28 to the C_DQ terminal of the controller IC 18 via the DQ terminal.

In the inspection mode, a TEST signal is sent from the C_TEST terminal of the controller IC 18 to the TEST terminal of the DRAM 12 in order to activate the short detection circuits 24-4, 24-5, 24-6. When this is performed, the CKE terminal is isolated from the CKE control circuit 30 at the short detection circuit 24-5. Namely, the CKE control circuit 30 is applied with an H level signal from the short detection circuit 24-5 via the route labeled <7> in FIG. 5, placing the interior of the DRAM 12 in a WRT command state. Note that although the CKE terminal according to the present exemplary embodiment is active high, as described above, obviously the opposite logic may also be employed.

At the same time, the DQ terminal is isolated from the DQ control circuit 28 at the short detection circuit 24-6, and a signal input to the CKE terminal is sent to the DQ control circuit 28 via the route labeled <6> in FIG. 5 and is written to the DRAM 12. The data written to the DRAM 12 is read by the controller IC 18 through the DQ terminal via the route <8> in FIG. 5. The above operation enables inspection as to whether or not a short abnormality has arisen between the C_CKE terminal and the CKE terminal. Namely, in the inspection mode, a signal via the route labeled by the dashed arrow <7> is an input signal for the CKE control circuit 30, and the signal labeled by the dashed arrow <6> is an input (write) data signal for the DQ control circuit 28.

More detailed explanation follows regarding operation of the inspection circuit 14a, with reference to FIG. 6 and FIG. 7. FIG. 6 is a timing chart illustrating operation of the inspection circuit 14a in a case in which a short abnormality has not occurred between the C_CKE terminal and the CKE terminal. FIG. 6 illustrates commands sent from the controller IC 18 to the DRAM 12 and the waveforms at respective sections. FIG. 7 is a timing chart illustrating operation of the inspection circuit 14a in a case in which a short abnormality has occurred between the C_CKE terminal and the CKE terminal. FIG. 7 illustrates commands sent from the controller IC 18 to the DRAM 12 and the waveforms at respective sections.

The commands, the clock signal CLK (CK), and the TEST signal illustrated at <1> in FIG. 6 are similar to those at <1> in FIG. 3, and so detailed explanation thereof is omitted.

Explanation follows regarding operation when an H level is input to the CKE terminal of the DRAM 12 from the C_CKE terminal of the controller IC 18 in cases in which a short abnormality has not occurred between the C_CKE terminal and the CKE terminal, with reference to <2> in FIG. 6. In this operation, an H level is written from the C_CKE terminal of the controller IC 18 via the CKE terminal of the DRAM 12, and this H level is read from the DRAM 12.

To begin, a signal input to the CKE terminal has the waveform illustrated at <3> in FIG. 6. Namely, the signal input to the CKE terminal is H level at the WRT command timing in order to write an H level to the DRAM 12. When this is performed, as illustrated at <4> in FIG. 6, since the input signal of the CKE terminal is active high, the input of the CKE control circuit 30 is set to H level by the short detection circuit 24-5. The CKE control circuit 30 operates accordingly. As illustrated at <5> in FIG. 6, at the WRT command timing, the H level input to the CKE terminal is input to the DQ control circuit 28 by the short detection circuit 24-6. Namely, an H level is written to the DRAM 12.

Accordingly, in a read operation, as illustrated at <6> in FIG. 6, an H level is read via the DQ terminal, with the logic of the write data and the logic of the read data of the DRAM 12 matching each other at the H level. The controller IC 18 therefore determines the connection between the C_CKE terminal and the CKE terminal to be correct.

Next, explanation follows regarding operation when an L level is input to the CKE terminal of the DRAM 12 from the C_CKE terminal of the controller IC 18 in cases in which a short abnormality has not occurred between the C_CKE terminal and the CKE terminal, with reference to <7> in FIG. 6. In this operation, an L level is written from the C_CKE terminal of the controller IC 18 via the CKE terminal of the DRAM 12, and this L level is read from the DRAM 12.

To begin, a signal input to the CKE terminal has the waveform as illustrated at <8> in FIG. 6. Namely, the controller IC 18 inputs an L level to the CKE terminal at the WRT command timing. Since the CKE control circuit 30 normally operates at the H level, as illustrated at <9> in FIG.

6, the short detection circuit 24-5 converts the L level signal input to the CKE terminal to H level at the WRT command timing and inputs the converted H level signal to the CKE control circuit 30.

As illustrated at <10> in FIG. 6, the signal input to the DQ control circuit 28 at the WRT command timing is at the L level due to an L level CKE signal being input via the short detection circuits 24-5, 24-4, 24-6. Namely, an L level is written to the DRAM 12. Accordingly, in a read operation, as illustrated at <11> in FIG. 6, an L level is read via the DQ terminal, with the logic of the write data and the logic of the read data matching each other at the L level. The controller IC 18 therefore determines the connection between the C_CKE terminal and the CKE terminal to be correct.

Next, explanation follows regarding operation of the inspection circuit 14a in cases in which a short abnormality has occurred between the C_CKE terminal and the CKE terminal, with reference to FIG. 7. This example assumes a short abnormality to the H level, for example a short circuit to a power source VDD, has occurred between the C_CKE terminal and the CKE terminal. The commands, the CLK (CK) signal, and the TEST signal illustrated at <1> in FIG. 7 are similar to those illustrated at <1> in FIG. 3, and so detailed explanation thereof is omitted.

As illustrated at <2> in FIG. 7, in this example, the controller IC 18 sends an L level from the C_CKE terminal to the CKE terminal of the DRAM 12 as an input signal (test signal) to inspect the CKE terminal of the DRAM 12. However, since a short to the H level has occurred between the C_CKE terminal and the CKE terminal, as illustrated at <3> in FIG. 7, the CKE terminal input remains at the H level. In order to achieve normal operation of the CS control circuit 26, as illustrated at <4> in FIG. 7, the short detection circuit 24-5 sends an H level to the CKE control circuit 30.

However, in this example, when attempting to write an L level to the 1-bit memory in the DRAM 12, since the signal input to the CKE terminal remains at the H level, as illustrated at <5> in FIG. 7, the short detection circuit 24-6 sends an H level to the DQ control circuit 28. Accordingly, an H level is written to the DRAM 12. As illustrated at <6> in FIG. 7, the controller IC 18 therefore reads an H level from the DRAM 12 via the DQ terminal. Even if an L level has been written, the level read from the DRAM 12 will always be H level. Since the write data and the read data do not match, the controller IC 18 determines that a short abnormality to the H level has occurred in the connection between the C_CKE terminal and the CKE terminal.

As described above, the inspection circuit, the semiconductor storage element, the semiconductor device, and the connection inspection method according to the present exemplary embodiment may easily detect a short abnormality (short circuit), in cases in which the short abnormality has occurred in the connection between the C_CKE terminal and the CKE terminal.

Note that in the exemplary embodiments described above, explanation has been given regarding configurations of a semiconductor device that inspects either the connection between the C_CS terminal of the controller IC 18 and the CS terminal of the DRAM 12 separately or inspects the connection between the C_CKE terminal of the controller IC 18 and the CKE terminal of the DRAM 12. However, there is no limitation thereto, and, for example, the semiconductor device may be configured with functionality to inspect both of these connections. In such cases, basically both the inspection circuit 14 illustrated in FIG. 2 and the inspection circuit 14a illustrated in FIG. 5 are provided, and configuration may be such that the short detection circuit 24-1 and the short detection circuit 24-4 employ common configuration, with a single C_TEST terminal being provided to the controller IC 18 and a single TEST terminal being provided to the DRAM 12.

What is claimed is:

1. An inspection circuit that executes an inspection of a connection state between a semiconductor storage element including a storage section that stores data, and a semiconductor element connected to the semiconductor storage element, the inspection circuit comprising:
    an input terminal that is input with a test signal to be sent to a first controller;
    an input/output terminal that is input with data to be written to the storage section and that outputs data read from the storage section;
    a first inspection section that is input with an inspection signal;
    a second inspection section, disposed between the input terminal and the first controller, that converts the test signal to a control signal at a predetermined logic level under control of the first inspection section; and
    a third inspection section, disposed between the input/output terminal and a second controller, that sends the test signal to the second controller under control of the first inspection section.

2. The inspection circuit of claim 1, wherein inspection of the connection state is executed by writing the test signal to the storage section, reading the test signal from the storage section, and comparing the written data with the read data.

3. The inspection circuit of claim 1, wherein inspection of the connection state is executed by inspecting whether or not a short circuit to the predetermined logic level has occurred between the input terminal and a terminal of the semiconductor element connected to the input terminal.

4. The inspection circuit of claim 1, wherein:
    the test signal is set to an opposite logic level to the predetermined logic level at a timing for writing to the storage section; and
    the second inspection section converts the test signal to the control signal at the predetermined logic level at a timing for writing to the storage section.

5. The inspection circuit of claim 1, wherein the third inspection section sends the test signal, received from the input terminal via the second inspection section and the first inspection section, to the second controller.

6. The inspection circuit of claim 1, wherein the first controller is a controller that executes a chip selection function and the control signal is a chip selection signal, or the first controller is a controller that executes a clock enable function and the control signal is a clock enable signal.

7. A semiconductor storage element comprising:
    a storage section;
    a first controller, the first controller being configured to execute a given function accompanying storage in the storage section when a control signal is at a predetermined logic level;
    a second controller, the second controller being configured to control writing of data to the storage section and reading of data from the storage section; and
    an inspection circuit that executes an inspection of a connection state between the semiconductor storage element, and a semiconductor element connected to the semiconductor storage element,
    the inspection circuit comprising
        an input terminal that is input with a test signal to be sent to the first controller, an input/output terminal that is input with the data to be written to the storage section and that outputs the data read from the storage section,
a first inspection section that is input with an inspection signal,
a second inspection section, disposed between the input terminal and the first controller, that converts the test signal to the control signal at the predetermined logic level under control of the first inspection section, and
a third inspection section, disposed between the input/output terminal and the second controller, that sends the test signal to the second controller under control of the first inspection section.

8. A semiconductor device comprising:
a semiconductor element; and
a semiconductor storage element comprising
a storage section,
a first controller, the first controller being configured to execute a given function accompanying storage in the storage section when a control signal is at a predetermined logic level,
a second controller, the second controller being configured to control writing of data to the storage section and reading of data from the storage section, and
an inspection circuit that executes an inspection of a connection state between the semiconductor storage element and the semiconductor element,
the inspection circuit comprising
an input terminal that is input with a test signal to be sent to the first controller,
an input/output terminal that is input with the data to be written to the storage section and that outputs the data read from the storage section,
a first inspection section that is input with an inspection signal,
a second inspection section, disposed between the input terminal and the first controller, that converts the test signal to the control signal at the predetermined logic level under control of the first inspection section, and
a third inspection section, disposed between the input/output terminal and the second controller, that sends the test signal to the second controller under control of the first inspection section.

9. The semiconductor device of claim 8, wherein the semiconductor element is a microcontroller including:
a first output terminal that sends the test signal to the input terminal;
a second output terminal that sends the inspection signal to the first inspection section; and
a data input terminal that is input with data from the input/output terminal,
wherein, execution of the inspection by the inspection circuit is controlled by the inspection signal.

10. The semiconductor device of claim 8, wherein the semiconductor storage element and the semiconductor element are mounted in a microchip package.

11. A connection inspection method that uses an inspection circuit included in a semiconductor storage element, the semiconductor storage element including a storage section that stores data and a controller that executes a given function accompanying storage in the storage section in a case in which a control signal is at a predetermined logic level, the connection inspection method comprising:
inputting a test signal through an input terminal that is input with a signal sent to the controller;
at a timing for writing to the storage section, converting the test signal to a control signal of the predetermined logic level, and inputting the converted signal to the controller;
writing, at the timing for writing to the storage section, the test signal to the storage section;
reading the test signal stored in the storage section; and
inspecting a connection state between an input terminal of the semiconductor storage element and a terminal corresponding to the input terminal on a semiconductor element connected to the semiconductor storage element by comparing the test signal written to the storage section to the test signal read from the storage section.

* * * * *